(12) United States Patent
Han et al.

(10) Patent No.: US 6,730,591 B2
(45) Date of Patent: May 4, 2004

(54) METHOD OF USING SILICON RICH CARBIDE AS A BARRIER MATERIAL FOR FLUORINATED MATERIALS

(75) Inventors: Licheng Han, Singapore (SG); Xu Yi, Singapore (SG); Simon Chooi, Singapore (SG); Mei Sheng Zhou, Singapore (SG); Joseph Zhifeng Xie, Singapore (SG)

(73) Assignees: Chartered Semiconductor Manufacturing Ltd., Singapore (SG); Institute of Microelectronics, Singapore (SG)

( * ) Notice: Subject to any disclaimer, the term of this patent is extended or adjusted under 35 U.S.C. 154(b) by 134 days.

(21) Appl. No.: 10/186,532

(22) Filed: Jul. 1, 2002

(65) Prior Publication Data

US 2002/0164872 A1 Nov. 7, 2002

Related U.S. Application Data

(62) Division of application No. 09/594,415, filed on Jun. 16, 2000, now Pat. No. 6,429,129.

(51) Int. Cl.$^7$ .......................................... H01L 21/4763
(52) U.S. Cl. ...................... 438/618; 438/623; 438/627; 438/629; 438/630; 438/687; 438/688; 438/931
(58) Field of Search ..................... 438/105, 787–790, 438/618–629, 631, 633–634, 637–640, 643–645, 653–654, 685–688, 668, 672–673, 675, 931

(56) References Cited

U.S. PATENT DOCUMENTS

| | | | |
|---|---|---|---|
| 3,830,668 A | 8/1974 | Dearnaley et al. | ............ 148/1.5 |
| 5,736,457 A | 4/1998 | Zhao | ............ 438/624 |
| 5,744,817 A | 4/1998 | Shannon | ............ 257/29 |
| 5,817,572 A | 10/1998 | Chiang et al. | ............ 438/624 |
| 5,818,071 A * | 10/1998 | Loboda et al. | ............ 438/687 |
| 6,297,149 B1 * | 10/2001 | Stamper | ............ 438/637 |
| 6,413,854 B1 * | 7/2002 | Uzoh et al. | ............ 438/637 |

* cited by examiner

Primary Examiner—Thanh Nguyen
(74) Attorney, Agent, or Firm—George O. Saile; Rosemary L. S. Pike; Stephen G. Stanton

(57) ABSTRACT

A method of forming interconnect structures in a semiconductor device, comprising the following steps. A semiconductor structure is provided. In the first embodiment, at least one metal line is formed over the semiconductor structure. A silicon-rich carbide barrier layer is formed over the metal line and semiconductor structure. Finally, a dielectric layer, that may be fluorinated, is formed over the silicon-rich carbide layer. In the second embodiment, at least one fluorinated dielectric layer, that may be fluorinated, is formed over the semiconductor structure. The dielectric layer is patterned to form an opening therein. A silicon-rich carbide barrier layer is formed within the opening. A metallization layer is deposited over the structure, filling the silicon-rich carbide barrier layer lined opening. Finally, the metallization layer may be planarized to form a planarized metal structure within the silicon-rich carbide barrier layer lined opening.

27 Claims, 2 Drawing Sheets

METHOD OF USING SILICON RICH CARBIDE AS A BARRIER MATERIAL FOR FLUORINATED MATERIALS

This is a division of patent application Ser. No. 09/594, 415, filing date Jun. 16, 2000, now U.S. Pat. No. 6,429,129, Method Of Using Silicon Rich Carbide As A Barrier Material For Flourinated Materials, assigned to the same assignee as the present invention.

FIELD OF THE INVENTION

The present invention relates generally to forming interconnect structures in semiconductor devices, and more specifically to methods of incorporating fluorinated amorphous carbon and fluorocarbon polymers in the formation of interconnect structures in semiconductor devices.

BACKGROUND OF THE INVENTION

The miniaturization of microelectronic devices and the need for higher speeds have created a demand for low dielectric constant (low-k) materials. Fluorinated amorphous carbon and fluorocarbon polymer films exhibit excellent low dielectric constant properties due to the incorporation of less polarizable fluorine atoms.

One of the primary concerns with these films is that they release fluorine upon heating. Materials, such as Ta, TaN, Ti, TiN, and Al, etc., in contact with these films may react with the fluorine and/or fluorine bearing species thereby compromising the interfacial adhesion between the films and materials.

Thus, a fluorine diffusion barrier is needed for the integration of fluorinated low-k materials.

U.S. Pat. No. 5,817,572 to Chiang et al. describes a method for forming interconnections for semiconductor fabrication and semiconductor devices. In one embodiment, a silicon carbide (SiC) etch barrier is used in a dual damascene process.

U.S. Pat. No. 5,744,817 to Shannon describes a hot carrier transistor and a method of making a hot carrier transistor wherein the emitter region films 20a, 20b may comprise silicon-rich amorphous silicon carbide.

U.S. Pat. No. 5,736,457 to Zhao describes a method of making a single or dual damascene process where an IMD layer 105 may be comprised of SiC.

U.S. Pat. No. 3,830,668 to Dearnaley et al. describes a method of forming electrically insulating layers in semi-conducting materials. A block of SiC is irradiated with protons to form a layer or radiation damage and releases a certain amount of carbon impurity atoms from their substitutional-sites. The structure is irradiated with low energy electrons and then annealed in which the released carbon atoms migrate and precipitate in the region of the radiation-damaged layer.

U.S. Pat. No. 5,891,803 to Gardner describes a dual damascene process with a dielectric layer 340 that may be comprised of SiC.

SUMMARY OF THE INVENTION

Accordingly, it is an object of the present invention to provide a method of forming a barrier layer for use with fluorinated dielectric layers and/or intermetal dielectric layers (IMDs).

Another object of the present invention to provide a method of forming a barrier layer for use with fluorinated dielectric layers and/or intermetal dielectric layers (IMDs) that blocks diffusion of fluorine through the barrier layer.

Other objects will appear hereinafter.

It has now been discovered that the above and other objects of the present invention may be accomplished in the following manner. Specifically, a semiconductor structure is provided. In the first embodiment, at least one metal line is formed over the semiconductor structure. A silicon-rich carbide barrier layer is formed over the metal line and semiconductor structure. Finally, a fluorinated dielectric layer is formed over the silicon-rich carbide layer. In the second embodiment, at least one fluorinated dielectric layer is formed over the semiconductor structure. The fluorinated dielectric layer is patterned to form an opening therein. A silicon-rich carbide barrier layer is formed within the opening. A metallization layer is deposited over the structure, filling the silicon-rich carbide barrier layer lined opening. Finally, the metallization layer may be planarized to form a planarized metal structure within the silicon-rich carbide barrier layer lined opening.

BRIEF DESCRIPTION OF THE DRAWINGS

The features and advantages of the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

First Embodiment—Al/Low-k Scheme

Figure 1:
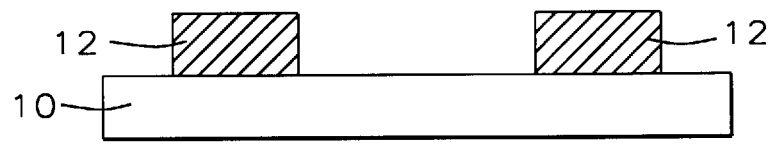
FIGS. 1 to 3 schematically illustrate in cross-sectional representation a first embodiment of the present invention.

Accordingly as shown in FIG. 1, starting semiconductor structure 10 is understood to possibly include a semiconductor wafer or substrate, active and passive devices and interconnects and contact plugs formed within the wafer, conductive layers and dielectric layers (e.g., inter-poly oxide (IPO), intermetal dielectric (IMD), etc.) formed over the wafer surface. The term, "semiconductor structure" is meant to include devices formed within a semiconductor wafer and the layers overlying the wafer. Unless otherwise specified, all structures, layers, etc. may be formed or accomplished by conventional methods known in the prior art. A "low-k" material is any material that has a dielectric constant that is less than silicon oxide.

The upper surface of semiconductor structure 10 can be comprised of a dielectric layer, e.g. ILD layer, an ILD layer with conductive plugs exposed, an intermetal layer (IMD), or an IMD layer with metal plugs or lines exposed (not shown).

Metal lines 12, for example, are formed over semiconductor structure 10. Metal lines 12 may be formed from one or more materials selected from the group comprising aluminum (Al), aluminum-copper alloy (Al—Cu), copper (Cu), and tungsten (W) with a titanium (Ti)/titanium nitride (TiN) and/or tantalum nitride (TaN) metal barrier layer and are preferably formed of a aluminum-copper alloy (Al—Cu) with a titanium (Ti)/titanium nitride (TiN) barrier layer. For purposes of illustration, metal lines 12 will be considered to be comprised of aluminum-copper alloy (Al—Cu) with a barrier layer.

Although a line structure is formed, the present invention is not so limited and other structures may be formed and used with the present invention.

Figure 2:
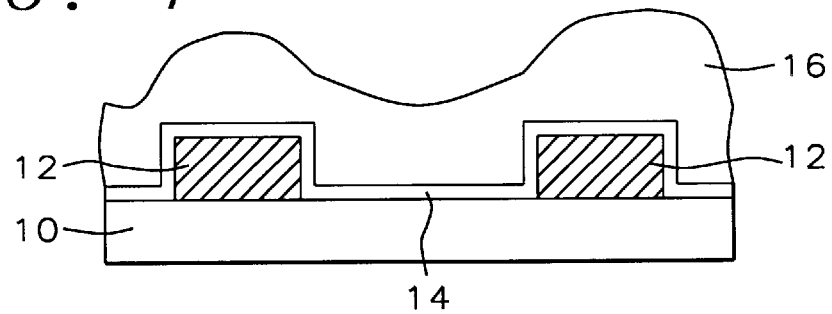

As shown in FIG. 2, silicon-rich carbide (SRC) layer 14 is formed over Al—Cu lines 12 and semiconductor structure 10 to form a barrier layer. Barrier layer 14 is from about 30 to 2000 Å thick, and is more preferably from about 100 to 500 Å thick.

SRC layer 14 is formed within a plasma enhanced chemical-vapor deposition (PECVD) chamber (not shown) by varying the ratio of silane ($SiH_4$) and the source of carbon (such as C2H2, CH4, C2H6, etc.). The ratio of silane to the source of carbon may be from 0.05 to 10. Alkyl- and aryl-substituted silane precursors (e.g. $(CCH_3)SiH_3$) may be used instead of silane.

Alternatively, SRC layer 14 may be formed by physical vapor deposition (PVD) on a magnetron sputtering equipment using a graphite target and silane gas. The main sputtering parameters are: power—between about 1 and 20 kW; magnetic field—between about 20 and 200 Gauss; temperature—between about 20 and 500° C.; and pressure—between about 0.1 and 1000 mTorr.

SRC layer 14 has a dielectric constant of from about 4.0 to 7.0. The parameters for forming SRC layer 14 are: temperature—from about 250 to 450° C., and more preferably about 400° C.; pressure—from about 0.01 to 10 Torr, and more preferably from about 0.5 to 2 Torr; time—from about 1 to 200 seconds, and more preferably from about 3 to 10 seconds; and microwave or RF power call be capacitively coupled to plasma at from about 200 to 5500W, and more preferably at about 1000W.

Alternatively, SRC layer 14 may be formed by physical vapor deposition (PVD) on a magnetron sputtering equipment using a graphite target and silane gas. The main sputtering parameters are: power—between about 1 and 20 kW; magnetic field—between about 20 and 200 Gauss; temperature—between about 20 and 500° C.; and pressure—between about 0.1 and 1000 mTorr.

Dielectric layer, or ILD, 16 is deposited over SRC barrier layer 14. Dielectric layer 16 may be comprised of any low-k dielectric material, more preferably a fluorinated dielectric material such as fluorosilicate glass (FSG), and most preferably a fluorinated polyimide, amorphous fluorocarbon, polytetra-fluoroethylene (PTFE), Teflon® manufactured by DuPont, and parylene-F (PA-F). The fluorinated dielectric may be deposited through vapor deposition or spin-coating following by thermal treatment. For purposes of illustration, dielectric layer 16 will be considered to be comprised of a fluorinated dielectric.

SRC barrier layer 14 prevents diffusion of any fluorine released from fluorinated dielectric layer 16 into Al—Cu lines 12 as will be described below.

Fluorinated dielectric layer 16 has a dielectric constant from about 1.5 to 3.5.

Further, the adhesion between silicon-rich carbide barrier layer 14 and fluorinated dielectric layer 16, 16' is good due to the high chemical compatibility between silicon carbide and carbon-containing species.

Figure 3:
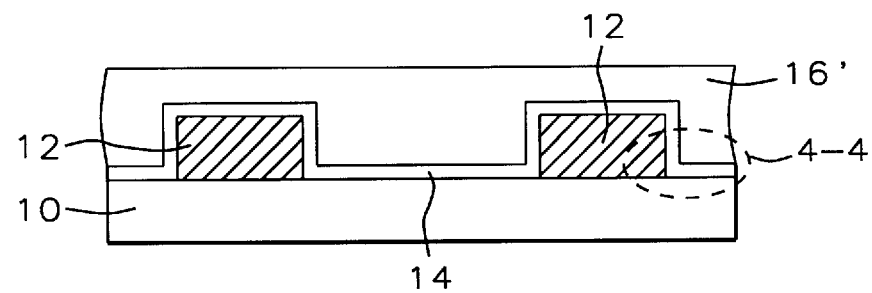

As shown in FIG. 3, fluorinated dielectric layer 16 may be planarized to form planarized fluorinated dielectric layer 16'. Although not shown, an undoped silicon dioxide (oxide) is typically deposited over fluorinated dielectric layer 16 prior to planarization by chemical mechanical polishing (CMP). This is done because not only is the CMP rate of the oxide layer is faster than a fluorinated dielectric material layer, but also CMP is not well established nor compatible with fluorinated organic low-k material.

Second Embodiment—Cu/Low-k Dual Damascene Scheme

Figure 5:
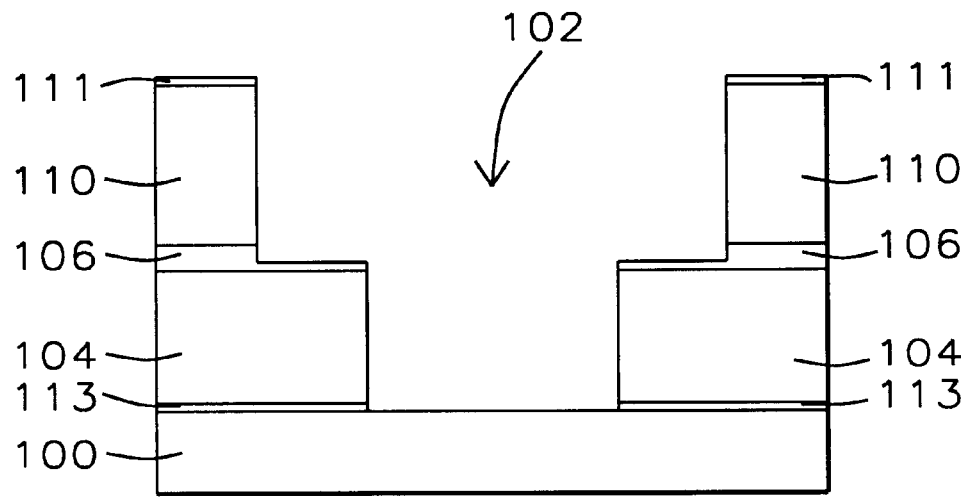
FIGS. 5 and 6 schematically illustrate in cross-sectional representation a second embodiment of the present invention.

As shown in FIG. 5, starting semiconductor structure 100 is understood to possibly include a semiconductor wafer or substrate, active and passive devices formed within the wafer, conductive layers and dielectric layers (e.g., inter-poly oxide (IPO), intermetal dielectric (IMD), etc.) formed over the wafer surface. The term "semiconductor structure" is meant to include devices formed within a semiconductor wafer and the layers overlying the wafer. Unless otherwise specified, all structures, layers, etc. may be formed or accomplished by conventional methods known in the prior art. A "low-k" material is any material that has a dielectric constant that is less than silicon oxide.

The upper surface of semiconductor structure 100 can be comprised of a dielectric layer, e.g. ILD layer, an ILD layer with conductive plugs exposed, an intermetal layer (IMD), or an IMD layer with metal plugs or lines exposed (not shown) or a conductor such as copper.

Dual damascene opening 102, for example, is then formed within first and second planarized dielectric layers 104, 110, respectively, separated by optional etch stop layer 106, over semiconductor structure 100. Optionally, a cap layer III may be formed over second planarized dielectric layer 110 and a passivation layer 113 may be formed over semiconductor structure 100.

Cap layer 111, etch stop layer 106, and passivation layer 113 are typically comprised of silicon nitride.

First and second planarized dielectric layers 104, 110 may be any low-k dielectric material, more preferably a fluorinated dielectric material such as fluorosilicate glass (FSG), and most preferably a fluorinated dielectric material such as a fluorinated polyimide, amorphous fluorocarbon, polytetra-fluoroethylene (PTFE), Teflon® manufactured by DuPont, and parylene-F (PA-F). For purposes of illustration, first and second dielectric layers 104, 110 will be considered to be comprised of a fluorinated dielectric.

Although a dual damascene structure is formed, the present invention is not so limited and a single damascene structure, for example, or other structure may be formed.

First and second fluorinated dielectric layer 104, 110 each have a dielectric constant from about 1.5 to 3.0.

Figure 6:
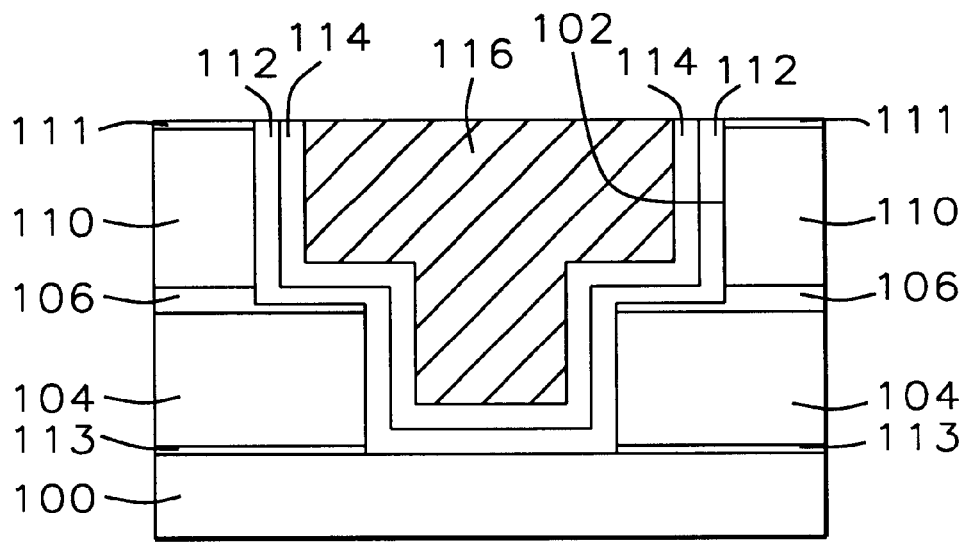

As shown in FIG. 6, silicon-rich carbide (SRC) barrier layer 112 is formed over the structure of FIG. 5, lining dual damascene opening 102. SRC barrier layer 112 is from about 30 to 2000 Å thick, and more preferably from about 100 to 500 Å thick.

SRC barrier layer 112 is formed within a plasma enhanced chemicalvapor deposition (PECVD) chamber (not shown) by varying the ratio of Silane ($SiH_4$) and the source of carbon (such as $C_2H_2$, $CH_4$, $C_2H_6$, etc.). The ratio of silane to the source of carbon may be from about 0.05 to 10.

SRC layer 112 may also be formed by physical vapor deposition (PVD) with a magnetron sputtering equipment using a graphite target and silane gas. The power is form about 1 and 20 kW; the magnetic field is between about 20 and 200 Gauss; the temperature is from about 20 and 500° C.; and the pressure is from about 0.1 and 1000 mTorr, SRC layer 112 has a dielectric constant of from about 4 to 7. The parameters for forming SRC layer 112 are: temperature—from about 250 to 450° C., and more preferably about 400° C.; pressure—from about 0.01 to 10 Torr, and more preferably from about 0.5 to 2 Torr; time—from about 1 to 200 seconds, and more preferably from about 3 to 10 seconds; and microwave or RF power can be capacitively coupled to plasma at from about 200 to 5500W, and more preferably at about 1000W.

Metal barrier layer 114 is then formed over SRC layer 114 within dual damascene opening 102. Metal barrier layer 114 may be comprised of Ta, TaN, Ti, TiN, W, WN, Mo, or MoN, etc. Metal barrier layer 114 may be from about 50 to 2000 Å thick.

A metallization layer is then deposited over the structure and planarized to form metal plug 116. Metal plug may be comprised of Al, W, Ti, or Cu and is preferably Cu. For purposes of illustration, metal plug 116 will be considered to be comprised of copper (Cu).

Metal barrier layer 114 prevents diffusion of Cu into first and/or second fluorinated dielectric layers 104, 110.

SRC barrier layer 112 prevents diffusion of any fluorine released from first and/or second fluorinated dielectric layers 104, 110 into metal barrier layer 114 as will be described below.

Further, the adhesion between silicon-rich carbide barrier layer 12 and first and second fluorinated dielectric layers 104, 110 is good due to the high chemical compatibility between silicon carbide and carbon-containing species.

Phases of SRC Barrier Layer 14—Common to Both Embodiments

Figure 4:
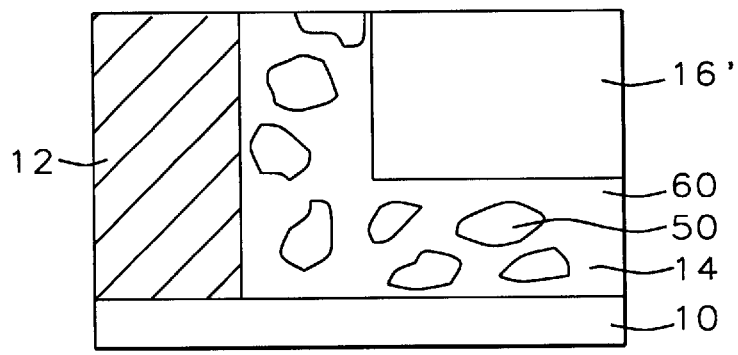
FIG. 4 is an enlarged portion of FIG. 3 within the dashed line box 4—4.

Common to both the first and second embodiment, and as shown in FIG. 4 (for example an enlarged portion of FIG. 3 within dashed line box 4—4) silicon-rich carbide (SRC) barrier layer, or film, 14 (and SRC barrier layer 112) includes two distinct phases: silicon islands 50; and PECVD silicon carbide 60.

Due to a high reaction tendency between fluorine and silicon elements, silicon island regions 50 in SRC layer 14 act as a "sink" that attracts and traps any fluorine atoms released from fluorinated layers 16, 16'; 104, 110 and prevents them from migrating or diffusing to any adjacent metal layer 12, 114 and thus reacting and compromising the interfacial adhesion between the films.

SUMMARY

The present invention provides a fluorine diffusion barrier 14, 112 than can be used in both Al—Cu/low-k and Cu/low-k metallization technology. SRC barrier layer 14, 112 allows the use of fluorine-containing low-k materials, i.e. fluorinated dielectric layers 16, 16'; 104, 110, as interlevel dielectrics (ILD) and intermetal dielectrics (IMD). Heretofore, such low-k fluorinated dielectric materials could not be used as ILDs and IMDs because of their fluorine reaction with metal layers, and their poor adhesion with metal layers.

While particular embodiments of the present invention have been illustrated and described, it is not intended to limit the invention, except as defined by the following claims.

We claim:

1. A method of forming interconnect structures in a semiconductor device, comprising the steps of:
    providing a semiconductor structure;
    forming at least one dielectric layer over said semiconductor structure;
    patterning said dielectric layer to form an opening therein;
    forming a silicon-rich carbide barrier layer within said opening; said silicon-rich carbide barrier layer including a first silicon island phase and a second silicon carbide layer;
    depositing a metallization layer over said structure and filling said silicon-rich carbide barrier layer lined opening; and
    planarizing said metallization layer to form a planarized metal structure within said silicon-rich carbide barrier layer lined opening.

2. The method of claim 1, wherein said metal structure is comprised of a material selected from the group consisting of Al, W, Ti, and Cu.

3. The method of claim 1, wherein said metal structure is comprised of Cu.

4. The method of claim 1, wherein said metal structure is a Cu dual damascene structure.

5. The method of claim 1, wherein said at least one dielectric layer is comprised of a material selected from the group consisting of fluorosilicate glass (FSG), fluorinated polyimide, amorphous fluorocarbon, polytetrafluoroethylene (PTFE), Teflon®, and parylene-F.

6. The method of claim 1, wherein said silicon-rich carbide barrier layer is from about 30 to 2000 Å thick.

7. The method of claim 1, wherein said silicon-rich carbide barrier layer is from about 100 to 500 Å thick.

8. The method of claim 1, wherein said silicon-rich carbide barrier layer is formed within a PECVD chamber at a temperature from about 250 to 450° C., a pressure from about 0.01 to 5 Torr, for about from 1 to 200 seconds to form a silicon-rich carbide layer of from about 30 to 2000 Å thick.

9. The method of claim 1, wherein said silicon-rich carbide barrier layer is formed within a PECVD chamber at a temperature of about 400° C., a pressure from about 0.5 to 2.0 Torr, for about from 3 to 10 seconds to form a silicon-rich carbide layer of from about 100 to 500 Å thick.

10. The method of claim 1, wherein said silicon-rich carbide barrier layer is formed by a PVD process within a magnetron sputtering equipment at a temperature of from about 20 and 500° C., a pressure from about 0.1 to 1000 mTorr, and a magnetic field between about 20 and 200 Gauss.

11. The method of claim 1, wherein said silicon-rich carbide barrier layer has a dielectric constant of from about 4.0 to 7.0, and said dielectric layer has a dielectric constant of from about 1.5 to 3.5.

12. The method of claim 1, wherein said silicon-rich carbide barrier layer has a dielectric constant of from about 4.0 to 5.0, and said dielectric layer has a dielectric constant of from about 2.2 to 2.9.

13. The method of claim 1, including the step of:
    forming a metal barrier layer over said silicon-rich carbide layer, before said metallization layer deposition step.

14. The method of claim 1, wherein said metal structure is a Cu single damascene structure.

15. A method of forming interconnect structures in a semiconductor device, comprising the steps of:
    providing a semiconductor structure;
    forming at least one fluorinated low-k dielectric layer over said semiconductor structure; wherein said at least one fluorinated low-k dielectric ILD layer is comprised of a material selected from the group consisting of fluorosilicate glass (FSG), fluorinated polyimide, amorphous fluorocarbon, polytetra-fluoroethylene (PTFE), Teflon®, and parylene-F;
    patterning said fluorinated low-k dielectric layer to form an opening therein;
    forming a silicon-rich carbide barrier layer within said opening; said silicon-rich carbide barrier layer including a first silicon island phase and a second silicon carbide layer;
    forming a metal barrier layer over said silicon-rich carbide layer;
    depositing a metallization layer over said structure and filling said metal barrier layer/silicon-rich carbide layer lined opening; and
    planarizing said metallization layer to form a planarized metal structure within said silicon-rich carbide barrier layer lined opening.

16. The method of claim 15, wherein said metal structure is comprised of a material selected from the group consisting of Al, W, Ti, and Cu.

17. The method of claim 15, wherein said metal structure is comprised of Cu.

18. The method of claim 15, wherein said metal structure is a Cu dual damascene structure.

19. The method of claim 15, wherein said silicon-rich carbide barrier layer is from about 30 to 2000 Å thick.

20. The method of claim 15, wherein said silicon-rich carbide barrier layer is from about 100 to 500 Å thick.

21. The method of claim 15, wherein said silicon-rich carbide barrier layer is formed within a PECVD chamber at a temperature from about 250 to 450° C., a pressure from about 0.01 to 5.0 Torr, for about from 1 to 200 seconds to form a silicon-rich carbide layer of from about 30 to 2000 Å thick.

22. The method of claim 15, wherein said silicon-rich carbide barrier layer is formed within a PECVD chamber at a temperature of about 400° C., a pressure from about 0.5 to 2.0 Torr, for about from 3 to 10 seconds to form a silicon-rich carbide layer of from about 100 to 500 Å thick.

23. The method of claim 15, wherein said silicon-rich carbide barrier layer is formed by a PVD process within a magnetron sputtering equipment at a temperature of from about 20 and 500° C., a pressure from about 0.1 to 1000 mTorr, and a magnetic field between about 20 and 200 Gauss.

24. The method of claim 15, wherein said silicon-rich carbide barrier layer has a dielectric constant of from about 4.0 to 7.0, and said fluorinated low-k dielectric layer has a dielectric constant of from about 1.5 to 3.5.

25. The method of claim 15, wherein said silicon-rich carbide barrier layer has a dielectric constant of from about 4.0 to 5.0, and said fluorinated low-k dielectric layer has a dielectric constant of from about 2.2 to 2.9.

26. The method of claim 15, wherein said metal barrier layer is from about 50 to 2000 Å thick.

27. The method of claim 15, wherein said metal structure is a Cu single damascene structure.

* * * * *